(12) United States Patent
Yang et al.

(10) Patent No.: US 9,450,074 B1
(45) Date of Patent: Sep. 20, 2016

(54) LDMOS WITH FIELD PLATE CONNECTED TO GATE

(75) Inventors: Fanling Hsu Yang, Beaverton, OR (US); Timothy K. McGuire, Beaverton, OR (US); Sudarsan Uppili, Portland, OR (US); Guillaume Bouche, Beaverton, OR (US)

(73) Assignee: Maxim Integrated Products, Inc., San Jose, CA (US)

(*) Notice: Subject to any disclaimer, the term of this patent is extended or adjusted under 35 U.S.C. 154(b) by 601 days.

(21) Appl. No.: 13/194,210

(22) Filed: Jul. 29, 2011

(51) Int. Cl.
  *H01L 29/40* (2006.01)
  *H01L 29/66* (2006.01)
  *H01L 29/78* (2006.01)

(52) U.S. Cl.
  CPC ....... *H01L 29/66681* (2013.01); *H01L 29/402* (2013.01); *H01L 29/404* (2013.01); *H01L 29/7816* (2013.01)

(58) Field of Classification Search
  CPC . H01L 29/00; H01L 29/0624; H01L 29/402; H01L 29/403; H01L 29/404; H01L 29/66681; H01L 29/7816; H01L 29/66674; H01L 29/0852
  USPC ....... 257/339, 355, 356, 409, 487, 492, 493, 257/E29.001, E29.009
  See application file for complete search history.

(56) References Cited

U.S. PATENT DOCUMENTS

| | | | |
|---|---|---|---|
| 5,517,046 A * | 5/1996 | Hsing et al. | 257/336 |
| 5,846,866 A * | 12/1998 | Huang | H01L 29/0878 257/E29.04 |
| 6,346,451 B1 * | 2/2002 | Simpson et al. | 438/311 |
| 2002/0145172 A1 * | 10/2002 | Fujishima et al. | 257/487 |
| 2003/0027383 A1 * | 2/2003 | Menut et al. | 438/202 |
| 2007/0090414 A1 * | 4/2007 | Sutou | H01L 27/0266 257/277 |
| 2009/0166754 A1 * | 7/2009 | Webb | H01L 29/42372 257/382 |
| 2009/0261409 A1 * | 10/2009 | Tsai et al. | 257/339 |
| 2009/0273028 A1 * | 11/2009 | Mallikarjunaswamy et al. | 257/335 |
| 2009/0315110 A1 * | 12/2009 | Vashchenko | H01L 29/0692 257/344 |
| 2011/0115019 A1 * | 5/2011 | Giles et al. | 257/341 |
| 2011/0303979 A1 * | 12/2011 | Hirasozu | H01L 29/0653 257/339 |

* cited by examiner

*Primary Examiner* — Galina Yushina
(74) *Attorney, Agent, or Firm* — Advent, LLP

(57) ABSTRACT

Semiconductor devices, such as laterally diffused metal oxide semiconductor (LDMOS) devices, are described that have a field plate connected to a gate of the device. In one or more implementations, the semiconductor devices include a substrate having a source region of a first conductivity type and a drain region of the first conductivity type. A gate is positioned over the surface and between the source region and the drain region. The gate is configured to receive a voltage so that a conduction region may be formed at least partially below the gate to allow majority carriers to travel between the source region and the drain region. The device also includes a field plate at least partially positioned over and connected to the gate. The field plate is configured to shape an electrical field generated between the source region and the drain region when a voltage is applied to the gate.

8 Claims, 10 Drawing Sheets

LDMOS WITH FIELD PLATE CONNECTED TO GATE

BACKGROUND

Laterally diffused metal oxide semiconductor (LDMOS) devices are used in power application devices because they complement both bipolar devices and complementary metal-oxide-semiconductor CMOS devices through bi-polar-CMOS-DMOS (BCD) processes. For example, LDMOS devices may be used in radio frequency amplifier devices and microwave power amplifier devices to furnish power application functionality. LDMOS devices rely on a shallow conduction layer formed under a LOCOS ("local oxidation of silicon") region or a STI (shallow trench isolation) region to handle the higher drain voltage, when the device is biased.

The on-state resistance ("$R_{ON}$") and the maximum breakdown voltage ("$BV_{DSS}$") of the device are two important characteristics of LDMOS designs. Gate resistance (Rg) is another important LDMOS characteristic that affects the frequency performance of the LDMOS. All three characteristics are important for the operating parameters for the LDMOS devices, which dictate the applications with which the devices may be utilized. On-state resistance is usually dependent upon the design/layout of the device, the process condition, temperature, diffusion length, and the various materials used to fabricate the devices. Breakdown voltage is defined as the largest reverse voltage that can be applied to a diode (e.g., a p-n junction) without causing an exponential increase in the current of the diode. Gate resistance is dependent upon the dopant and the silicoidation in the polysilicon gate and how the wiring metal ($1^{st}$ metal or $2^{nd}$ metal) is connected to the polysilicon.

SUMMARY

Semiconductor devices, such as LDMOS devices, are described that have a field plate connected to a gate of the device to reduce the gate resistance of the device. In one or more implementations, the semiconductor devices include a substrate having a source region of a first conductivity type and a drain region of the first conductivity type formed proximate to a surface of the substrate. A gate is positioned over the surface and between the source region and the drain region. The gate is configured to receive a voltage so that a conduction region may be formed at least partially below the gate to allow majority carriers to travel between the source region and the drain region. The device also includes a field plate at least partially positioned over and connected to the gate. The field plate is configured to shape an electrical field generated between the source region and the drain region when voltages are applied to the drain and gate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1A is a diagrammatic partial cross-sectional view illustrating a conventional laterally diffused metal oxide semiconductor (LDMOS) device.

FIG. 1A' is a diagrammatic partial cross-sectional view illustrating another implementation of a conventional LDMOS device.

Figure 2A:
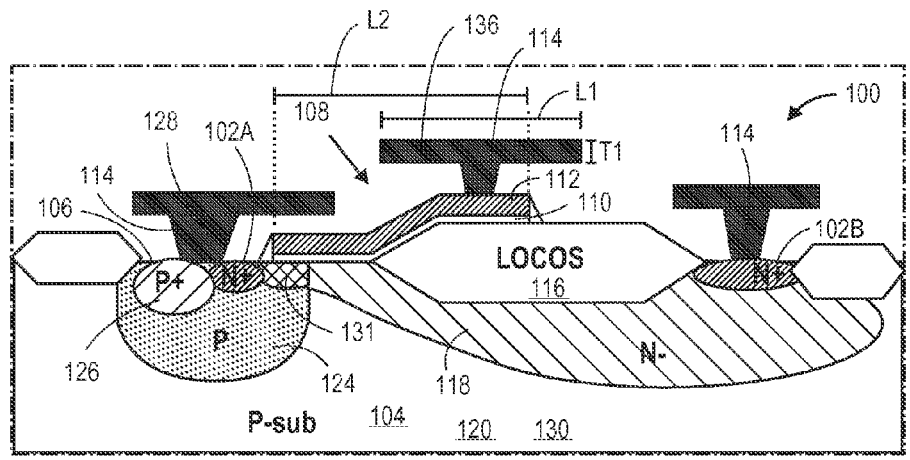
FIG. 2A is a diagrammatic partial cross-sectional view illustrating an implementation of a LDMOS device in accordance with an example implementation of the present disclosure.
Figure 2A:
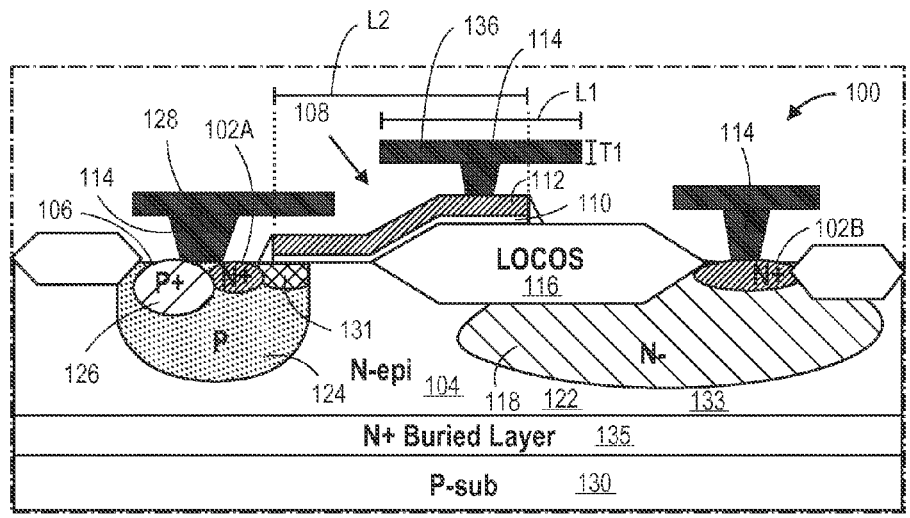
Figure 2B:
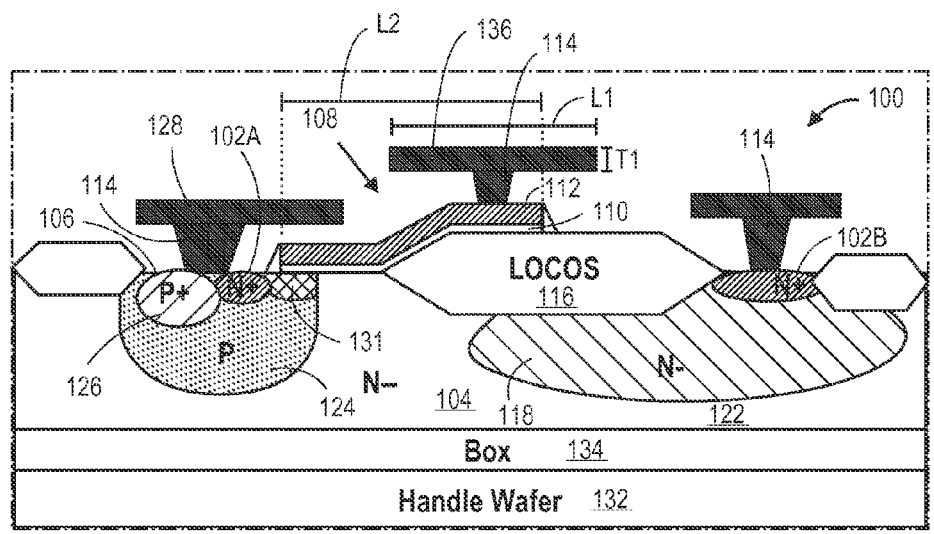

FIG. 2A' is a diagrammatic partial cross-sectional view illustrating another implementation of a LDMOS device in accordance with another example implementation of the present disclosure FIG. 2B is a diagrammatic partial cross-sectional view illustrating another implementation of a LDMOS device in accordance with another example implementation of the present disclosure.

Figure 3A:
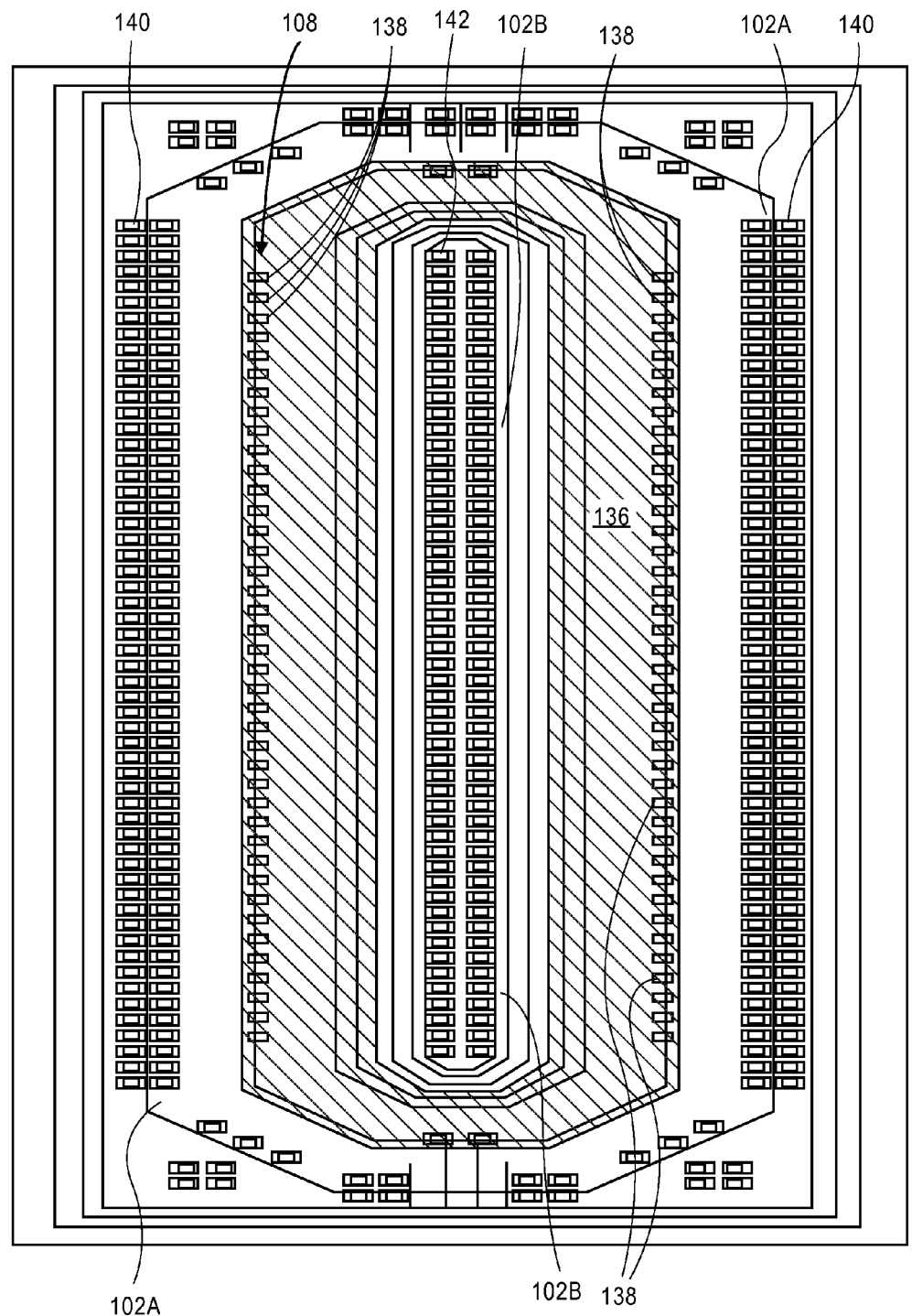
Figure 3B:
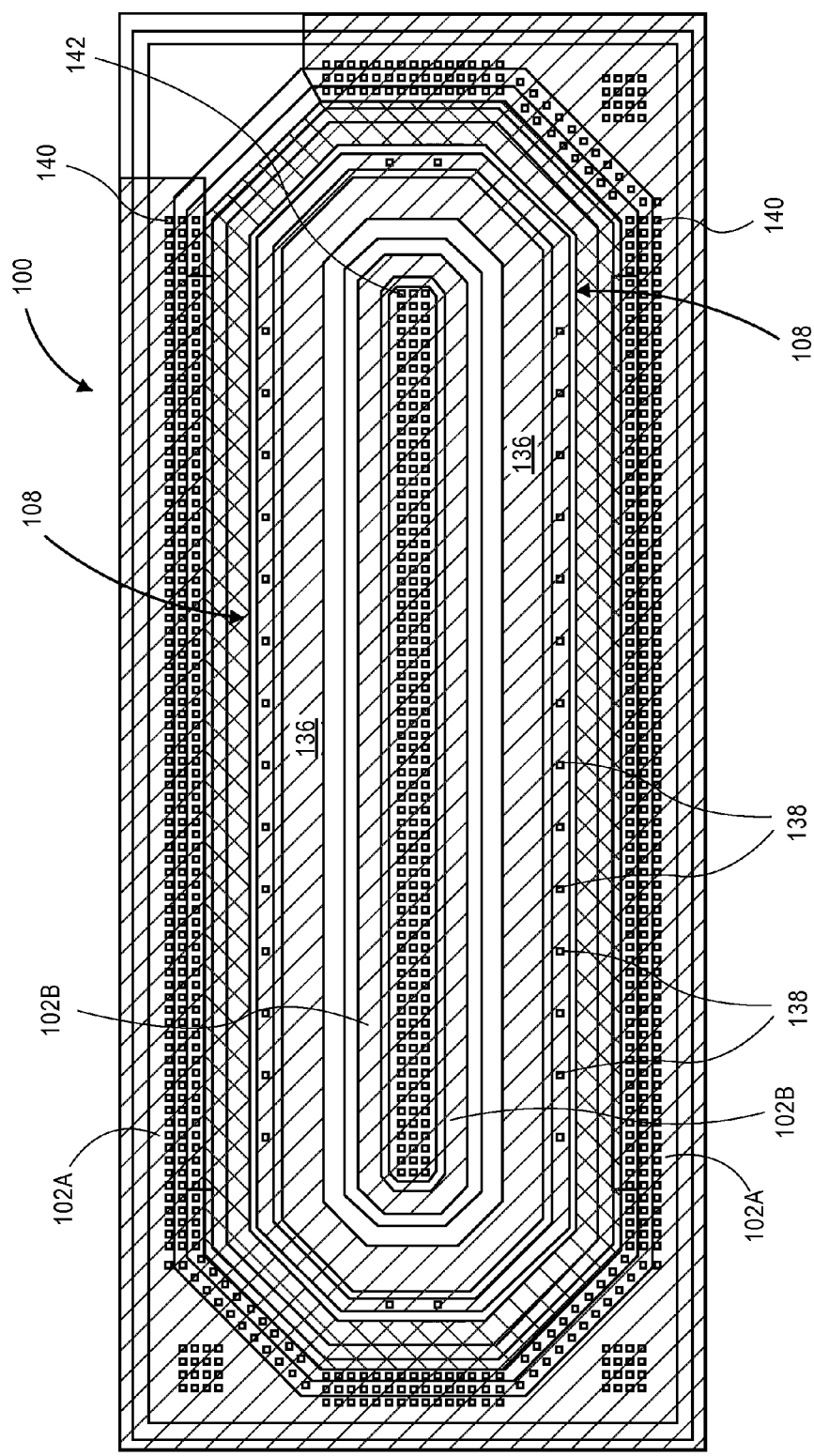

FIGS. 3A through 3B are diagrammatic plan views illustrating various example layout configurations of the LDMOS devices shown in FIGS. 2A through 2B.

Figure 4:
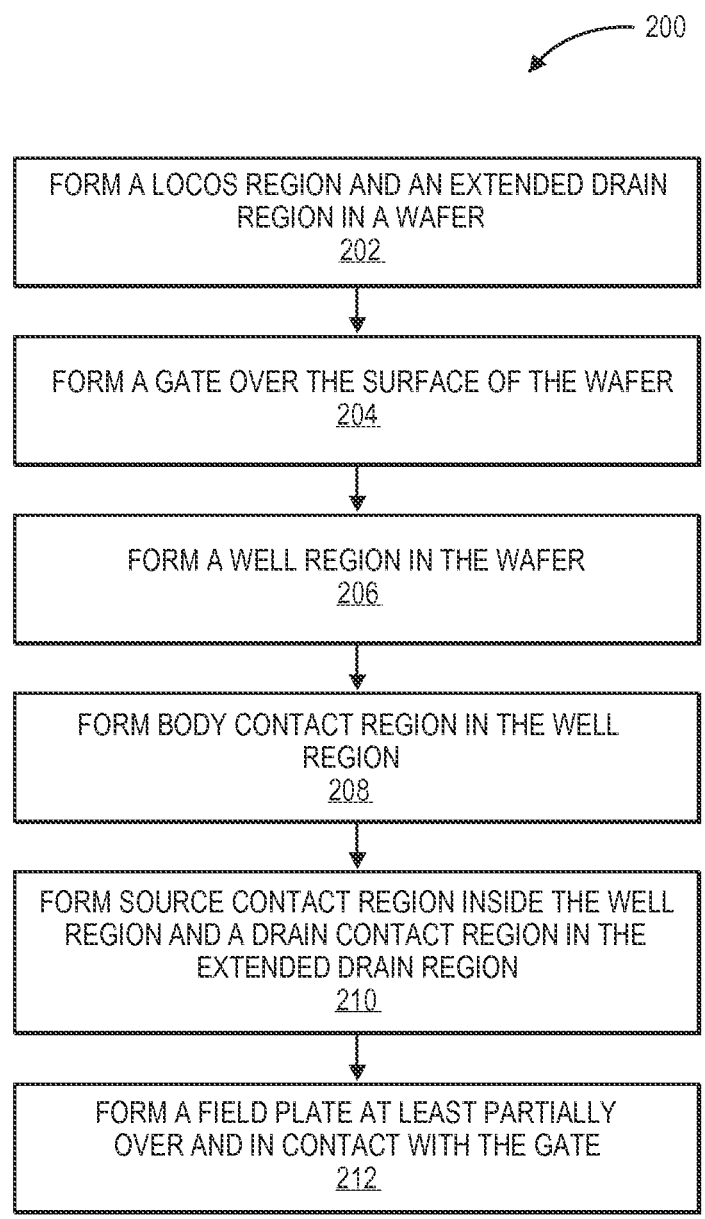

FIG. 4 is a flow diagram illustrating a process in an example implementation for fabricating LDMOS devices, such as the devices shown in FIGS. 2A through 2B.

Figure 5:
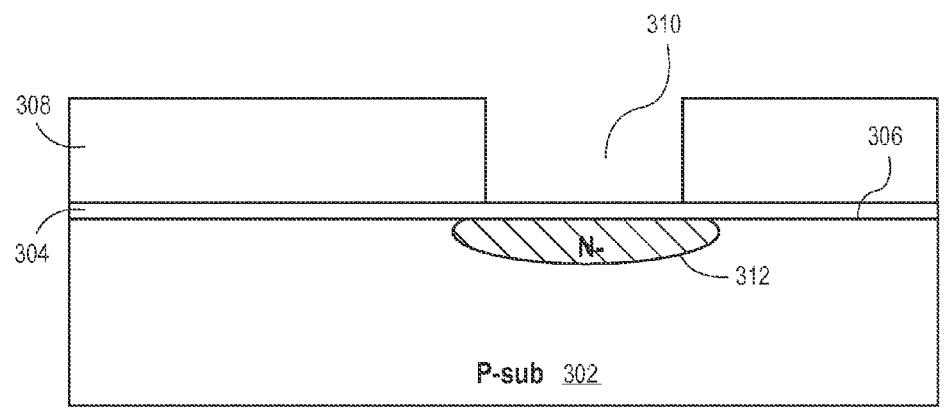
Figure 6:
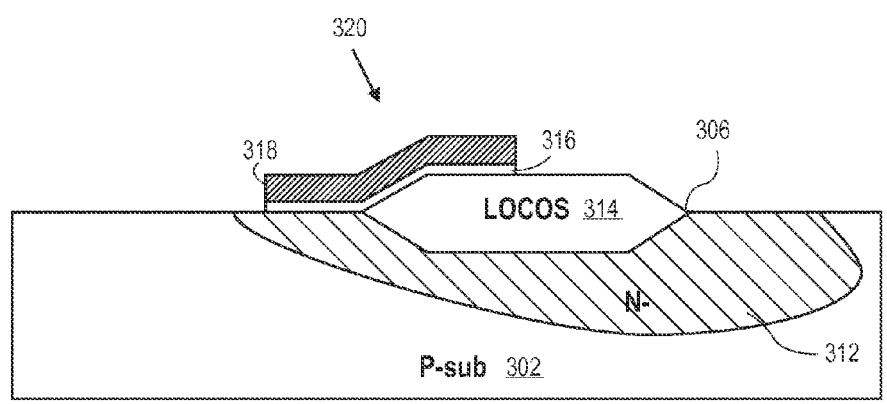
Figure 7:
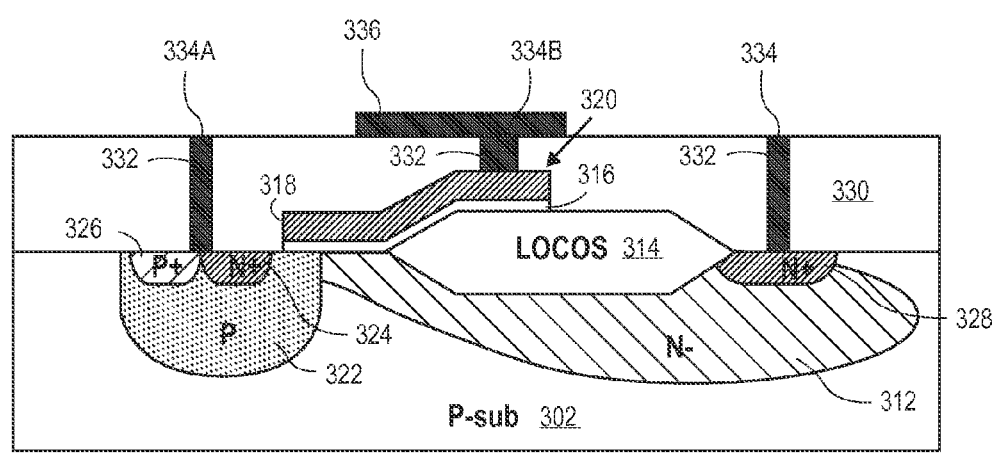

FIGS. 5 through 7 are diagrammatic partial cross-sectional views illustrating the fabrication of a LDMOS device, such as the device shown in FIG. 2A, in accordance with the process shown in FIG. 5.

DETAILED DESCRIPTION

Overview

Figure 1A:
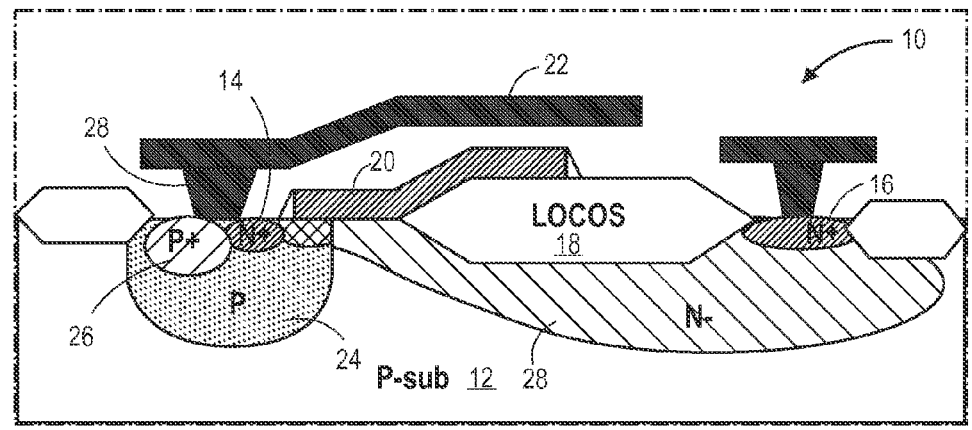
FIG. 1B is a diagrammatic partial cross-sectional view illustrating yet another implementation of a conventional LDMOS device.
FIG. 1C is a diagrammatic plan view of an example layout of the semiconductor device illustrated in FIGS. 1A and 1B.
Figure 1A:
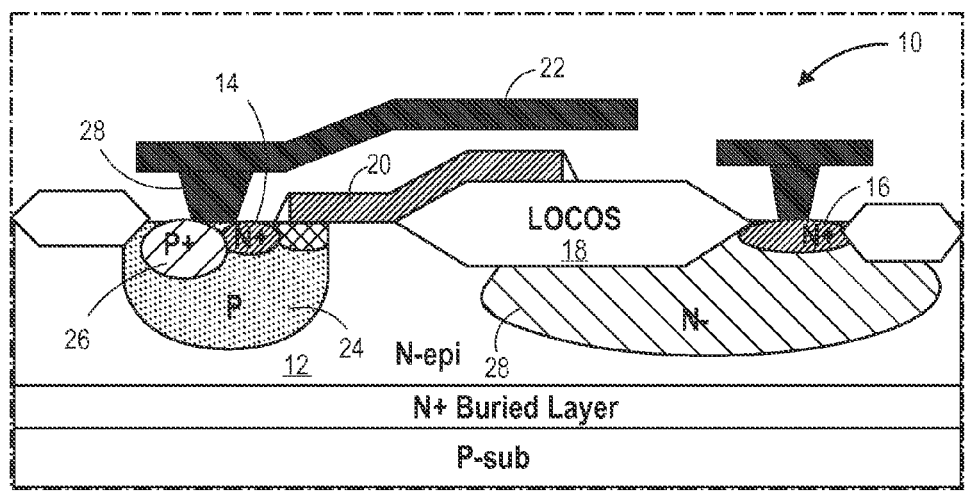
Figure 1B:
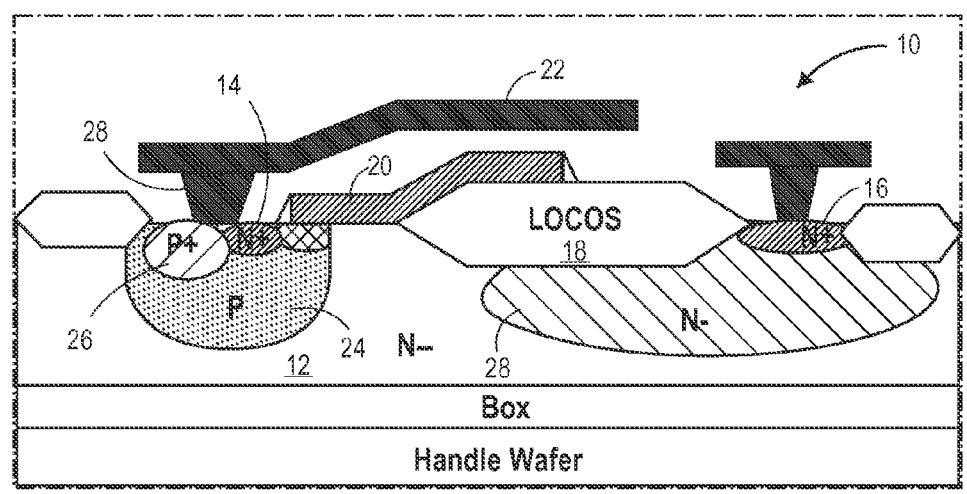
Figure 1C:
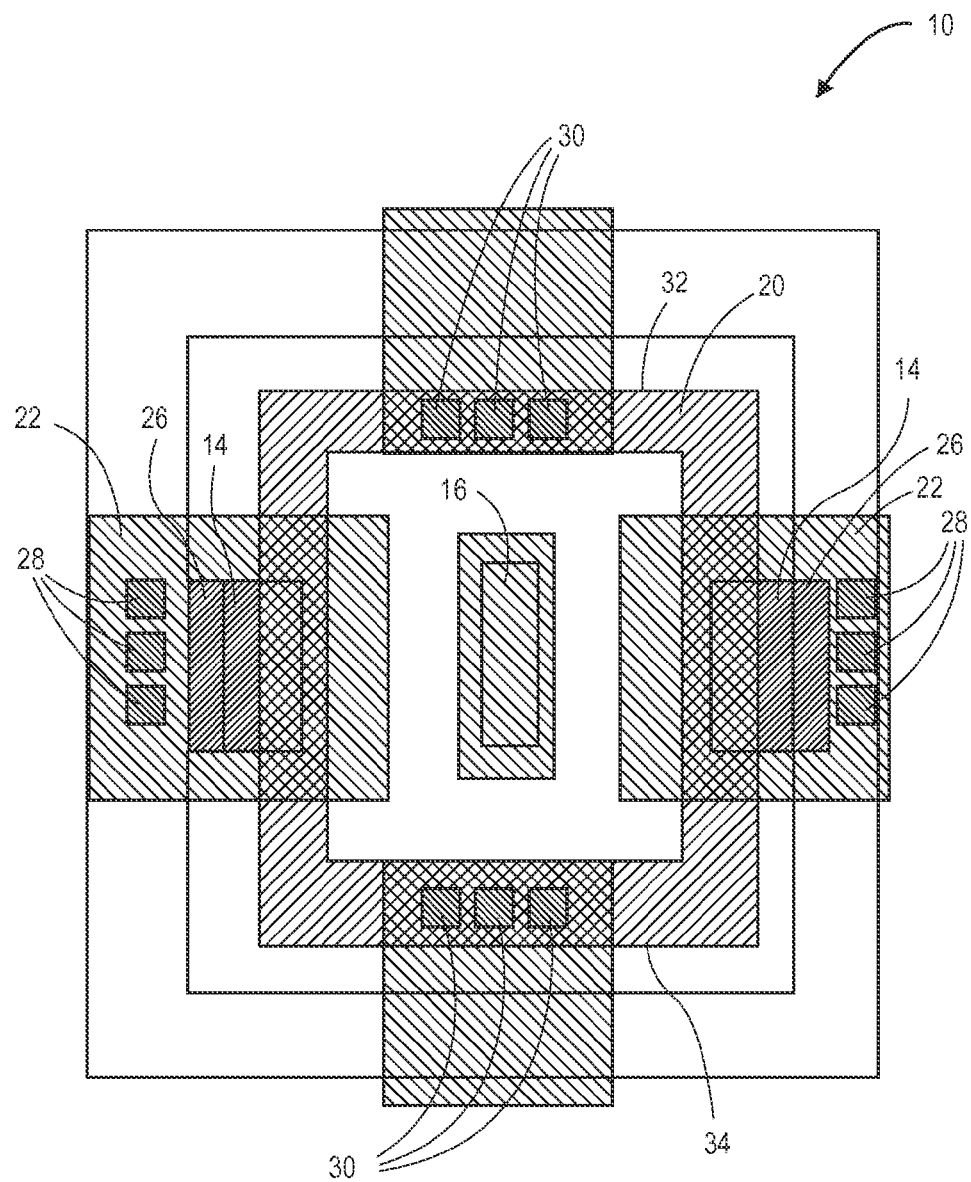

FIGS. 1A through 1C illustrate a conventional LDMOS device 10. As shown, the device 10 includes a substrate 12 having a source region 14 and a drain region 16 formed therein. The source region 14 and the drain region 16 are comprised of a first conductivity type (e.g., n-type dopant). A LOCOS region 18 is formed between the source region 14 and the drain region 16 to at least partially mitigate crosstalk in the device 10. A gate 20 is at least partially formed over the LOCOS region 18 and configured to receive a voltage to assist in generating a conduction layer between the source region 14 and the drain region 16. A field plate 22 is also at least partially disposed over the gate 20 and extended beyond to assist in shaping an electrical field in a drift region of the device 10. The device 10 also includes a well 24 comprised of a second conductivity type (e.g., p-type dopant) to house the source region 14 and a well contact region 26. As shown, the drain region 16 is housed within an extended drain region 28 (e.g., the N-region).

As shown in FIGS. 1A, 1A' and 1B the field plate 22, which is comprised of a conductive material (e.g., metal 1 layer), is connected to a source region contact 28 (e.g., an electrode comprised of metal 1 material, or the like). The field plate 22 is connected to the source contact 28 to maximize the potential difference between the field plate 22 and the drain region of the device 10 to maximize the ability of field plate 22 to shape the electrical field. However, as illustrated in FIG. 1C, since the source contact 28 is connected to the field plate 22, a gate connection 30 can only be made proximate to the edges 32, 34 of the device 10. Therefore, as the device 10 gets wider, the gate connections 30 to the gate 20 result in larger gate resistances. To get around this larger gate connection 30 resistance, integrated circuit designers typically build an array of smaller LDMOS devices 10 instead of one large LDMOS device 10. However, the increased number of devices 10 increases the footprint and the parasitic components of the device 10.

Therefore, techniques are described to fabricate semiconductor devices, such as LDMOS devices, having a field plate connected to a gate of the semiconductor device that allow for larger semiconductor devices with lower gate resistances. In one or more implementations, the semiconductor devices include a substrate having a source region of a first conductivity type and a drain region of the first conductivity type formed proximate to a surface of the substrate. A gate is positioned over the surface and between the source region and the drain region. The gate is configured to receive a voltage so that a conduction layer may be formed at least partially below the gate to allow majority carriers to travel between the source region and the drain region. The device also includes a field plate at least partially positioned over and connected to the gate. The field plate is configured to shape an electrical field generated between the source region and the drain region when voltages are applied to the drain and gate.

In the following discussion, an example semiconductor device is first described. Exemplary procedures are then described that may be employed to fabricate the example semiconductor device.

Example Implementations

FIGS. 2A through 2B illustrate LDMOS semiconductor devices 100 in accordance with example implementations of the present disclosure. For purposes of description, the LDMOS device 100 is illustrated at wafer level prior to singulation of the device 100. As shown, the LDMOS device 100 includes one or more active regions 102 (e.g., a source region 102A, a drain region 102B) formed in a substrate 104. The active regions 102 are utilized to create integrated circuit device technology (e.g., complementary metal-oxide-semiconductor (CMOS) technology, microelectromechanical systems (MEMS) technology, etc.). The active regions 102 may be configured in a variety of ways. In an implementation, the active regions 102 are capable of providing charge carriers within the substrate 104. For example, an active silicon region 102 may be comprised of an n-type diffusion region (e.g., a first conductivity type) that is capable of providing extra conduction electrons as charge carriers. In another example, an active silicon region 102 may be comprised of a p-type diffusion region (e.g., a first conductivity for PLDMOS), that is capable of providing extra holes as charge carriers. The one or more active regions 102 are formed proximate to a surface 106 of the substrate 104.

The substrate 104 comprises a base material utilized to form one or more integrated circuit devices through various fabrication techniques such as photolithography, ion implantation, deposition, etching, and so forth. In one or more implementations, the substrate 104 comprises a portion of a silicon wafer that may be configured in a variety of ways. For example, the substrate 104 may comprise a portion of an n-type silicon wafer or a portion of a p-type silicon wafer. In an implementation, the substrate 104 may comprise group V elements (e.g., phosphorus, arsenic, antimony, etc.) configured to furnish n-type charge carrier elements. In another implementation, the substrate 104 may comprise group IIIA elements (e.g., boron, etc.) configured to furnish p-type charge carrier elements.

The devices 100 also include a gate 108 that is formed over the surface 106 and between the active regions 102. A conduction layer region 131 is formed below the gate 108 (and inside p-well region 124) when a voltage of correct polarity and a value greater than a threshold voltage ($V_t$) of the device 100 is applied to the gate 108. The conduction layer establishes a conducting channel through which majority carriers can travel between the source region 102A and the drain region 102B (through the conduction region 131 and drift region 118). The gate 108 is configured in a variety of ways. The gate 108 includes a dielectric layer 110 disposed between the surface 106 and a polycrystalline silicon (polysilicon) layer 112. In one or more implementations, the dielectric layer 110 may comprise a gate oxide material, such as silicon dioxide ($SiO_2$), a nitride material, or the like. Moreover, the polysilicon layer 112 may include a silicide material to lower the resistivity of the polysilicon layer 112. The length of the gate 108 may vary as a function of the requirements (e.g., manufacturability, operating frequency, gain, efficiency etc.) of the device 100. For example, the length of the gate may range from approximately 1000 Angstroms to approximately 100,000 Angstroms.

The active regions 102A, 102B and the gate 108 each have a contact (e.g., an electrode) 114 that provides electrical interconnection capabilities between various components of devices 100. The contacts 114 may be configured in a variety of ways. For example, the contacts 114 may be comprised of a polysilicon material, a tungsten material (filling), a metal 1 material, a metal 2 material, and so forth. As illustrated in FIGS. 3A through 3B, the contacts 114 may include vias (not shown) that provide a vertical electrical connection between different layers of the device 100. For instance, a first via may provide an electrical interconnect to a drain contact 114 formed proximate to the surface 106 and disposed under various device 100 layers (e.g., passivation layers, insulation layers, etc.).

As illustrated in FIGS. 2A through 2B, the gate 108 may be at least partially positioned over a localized oxidation of silicon (LOCOS) or Shallow Trench isolation (STI) region 116. The LOCOS or STI region 116 is comprised of selected areas (e.g., region 116) of silicon dioxide (SiO2) formed in the substrate 104 so that a Si—$SiO_2$ interface of region 116 occurs at a lower point than the surface 106. The LOCOS or STI region 116 is configured to mitigate unwanted crosstalk between the first active region 102 (e.g., the source) and the second active region 102 (e.g., the drain), as well as other surrounding integrated circuit devices. The LOCOS region 116 may range from approximately 2000 Angstroms to approximately 20,000 Angstroms. It is contemplated that varying thicknesses of the LOCOS or STI region 116 may be utilized depending the voltage rating of the LDMOS device 100.

The semiconductor device 100 also includes an extended drain region 118 (e.g., a drift region) that extends at least partially under the LOCOS or STI regions 116. As illustrated in FIG. 2A, the extended drain region 118 surrounds the drain region 102B. The gate poly 108 and the field plate 136 create a reduced surface field (RESURF) effect on the extended drain region 118. The formed reduced field effect reduces drift region field to enhance device 100 breakdown voltage. The electric field across the drift region may be manipulated by the doping profile and the thickness of the extended drain region 118. Thus, it is contemplated that various doping profiles and thicknesses of the extended drain region 118 may be utilized depending on the requirements (e.g., breakdown voltage value, operating voltages, etc.) of the LDMOS devices 100. In one or more implementations, the extended drain region 118 may have a doping profile ranging from approximately $1e15/cm^3$ to approximately $8e18/cm^3$. The extended drain region 118 is laterally bounded by either a second conductivity region (e.g., a p-substrate region) 120 (shown in FIG. 2A), a first conductivity region (e.g., an n-type region) 122 (shown as an n-epitaxial region in FIG. 2A' or as an n--region in FIG. 2B). The region 131 under the gate 108, when the gate 108 is properly biased and in conjunction with regions 120, 122, functions as a channel region that allows majority carriers to travel between the source 102A and the drain 102B while the device 100 is operational. The n-type region 122 is configured to reduce the electric field across the device 100 to enable a higher operating voltage as well as reducing the series resistance of the device 100. In one or more implementations, the doping level of the extended drain region 118 is approximately three (3) times greater than the doping level of the n-type region 122. Therefore, the extended drain region 118 may have a doping profile ranging from approximately $1e15/cm^3$ to approximately $8e18/cm3$, and the n-type region 122 may have a doping profile ranging from approximately $3e14/cm^3$ to approximately $3e18/cm^3$.

As shown in FIG. 2A, the p-substrate region 120 at least substantially surrounds a well region 124. As shown in FIGS. 2A' and 2B, the n-type region 122 at least substantially surrounds the well region 124. The well region 124 is comprised of a second conductivity type and is at least partially covered by the gate 108. The source region 102A and the body contact region 126 are housed by the well region 124. The channel region 131 of the first conductive type is formed under gate 108 and within p-type region 124 when the gate 108 is properly biased. In one or more implementations, the source region 102A is comprised of a first conductive type, such as an n+ dopant material. The body contact 126 is comprised of a second conductive type, such as a p+ dopant material. In one or more implementations, the body-contact region 126 and the source region 102A are tied together with a single source electrode 128 (e.g., contact 114) to improve the reliability of the device and to reduce parasitic effects.

In FIG. 2A' the LDMOS device 100 illustrated may be fabricated utilizing a bulk substrate 130 of a second conductive type, such as a p-substrate. As shown in FIG. 2A', the bulk substrate 130 may include a first conductivity region 122, such as an n-type epitaxial region 133. The n-type epitaxial region 133 is separated from the bulk substrate 130 by an N+ buried layer 135. In FIG. 2B, the LDMOS devices 100 illustrated may be fabricated utilizing SOI wafer with a handle wafer 132 (e.g., handle wafer substrate) with a buried oxide (Box) layer 134 disposed between the handle wafer 132 and the n-type region 122. The handle wafer 132 is bonded to the substrate 104 though box layer 134 and serves to hold the various components of device 100 (e.g., active regions 102, gate 108, etc.) in at least a substantially fixed position with respect to each other during various fabrication processes. The SOI wafer with Box layer 134 serves to reduce parasitic effects through the substrate 104 as compared to bulk substrate configuration (e.g., the bulk substrate 130) shown in FIG. 2A.

In accordance with an aspect of the present disclosure, the LDMOS device 100 includes a field plate 136 at least partially positioned over the gate 108 and the LOCOS region 116. The field plate 136 may be configured in a variety of ways. For example, the field plate 136 may be comprised of a conductive material, such as a metal material (e.g., a metal 1 layer, a metal 2 layer, a metal 3 layer, etc.) or a polysilicon material. The field plate 136 is configured to assist in shaping the electric field under the LOCOS region 116 to improve the breakdown voltage when the devices 100 are operational (e.g., when a sufficient voltage is applied to the gate 108 and across the source 102A and the drain 102B). The field plate 136 length (L1) may differ to modify the electrical field under the LOCOS region 116 depending on the requirements of the devices 100. For example, in an implementation, the field plate 136 may have a length (L1) approximately equal to the gate 108 length (L2). In another implementation, the field plate 136 length (L1) may be greater than the gate 108 length (L2). The gate 108 length (L2) could range between about 0.1 um to over 20 um. The field plate 136 length (L1) may range between about 0.5 um to about 50 um depending upon the voltage rating of device 100. It is contemplated that the length of the field plate 136 is a function of the desired operating voltage. The field plate 136 may be formed over an interlayer-dielectric layer (not shown in FIG. 2A, 2A' or 2B). In one or more implementations, the interlayer-dielectric layer may be formed of a suitable low-K material (e.g., a fluorine-doped silicon dioxide material, a carbon-doped silicon dioxide material, a porous silicon dioxide material, etc.).

As shown in FIGS. 2A, 2A' and 2B, the field plate 136 is connected to the gate 108. As shown, the field plate 136 may be connected directly to the gate 108 with one or more contacts 138 (see FIGS. 3A through 3B). In one or more implementations, the contact may comprise a conductive material (e.g., metal, polysilicon, etc.) deposited in one or more vias so that an electrical connection is formed between the gate 108 and the field plate 136. As shown in FIG. 3B connecting the gate 108 to the field plate 136 allows for an increased number of gate contacts 138 compared to the gate contact configuration shown in FIG. 1C, which decreases the gate resistance and improves the switching characteristics of the LDMOS device 100.

As shown in FIGS. 3A through 3B, the gate contacts 138 may be formed along the length of the gate 108. The minimum distance between each gate contact 138 may be influenced by layout design rules. For example, the minimum distance between each gate contact 138 may be a few (e.g., two) microns. However, distances greater than two (2) microns and less than twenty (20) microns are possible as governed by layout design rules and design requirements. It is desired to connect the field plate 136 to the lowest potential of the device (normally at source 102 and body contact 126). This is to maximize the field shaping potential of the field plate. However, for high voltage device 100 applications (e.g., LDMOS devices 100 with an operating voltage of sixty volts or higher), the difference between the gate bias and the source/body bias is generally a small fraction of the drain bias. Moreover, as shown in FIGS. 3A through 3B, the field plate 136 connection to the gate 108 allows for an axi-symmetrical LDMOS device 100 with a controlled and desired electrical field across the drift region. For lower voltage device 100 applications (e.g., LDMOS devices 100 with an operating voltage of forty volts or lower), the field plate 136 (e.g., field plate 136 connected to the gate 108) configuration can also prevent gate de-biasing at the gate 108. Simulations have shown that the LDMOS device 100 layout configurations shown in FIGS. 3A through 3B reduce the resistance of each stripe of the gate 108 by two (2) orders of magnitude (for example, from 450Ω down to 5Ω in one implementation.). While FIGS. 3A through 3B illustrate two layout implementations, it contemplated that other layout configurations may be utilized in conjunction with the design and fabrication of the devices 100. As shown in FIGS. 3A and 3B, the LDMOS device 100 includes source contacts 140 and drain contacts 142 that electrically connect to the source region 102A and the drain region 102B, respectively. The gate contacts 138, the source contacts 140, and the drain contacts 142 are arranged in a parallel configuration with one another.

Thus, LDMOS devices 100 employing the aforementioned architecture may comprise a large width (a few millimeters wide) as a single cell rather than multiple cells configured to function as a single device 100 with a large width. It will be understood that while FIGS. 2A through 2C illustrate an n-channel LDMOS device 100, the devices 100 may be fabricated as p-channel devices.

Example Fabrication Processes

FIG. 4 illustrates an example process 200 that employs semiconductor fabrication techniques to fabricate semiconductor devices, such as the devices 100 shown in FIGS. 2A through 3B. FIGS. 5 through 7 illustrate formation of example LDMOS devices 300 in an example wafer 302. As illustrated in FIG. 4, a LOCOS (or a STI region) and an extended drain region are formed in a wafer (Block 202). In one or more implementations, as shown in FIG. 5, a pad oxide layer 304 is formed over a surface 306 of the wafer 302. A nitride layer 308 is formed over the pad oxide layer 304. The nitride layer 308 is patterned and etched to expose an area 310 where the LOCOS region is to be formed. A first conductive material (e.g., n-type dopant) is implanted through the exposed area 310 into the wafer 302 to form the extended drain region 312. It is contemplated that the extended drain region 312 may be implemented in conjunction with another layer of different conductive type (e.g., a p-type region when the extended drain region 118 is an n-type region) to form the RESURF region. Moreover, the extended drain region 312 may be formed in an n-type epitaxial layer (as shown in FIG. 2A'). Thermal cycling is then utilized to anneal and at least partially diffuse the extended drain region 312 while growing the LOCOS region 314. In one or more implementations, the LOCOS or the STI region 314 may be grown to a thickness ranging from approximately 2000 Angstroms to approximately 20,000 Angstroms. Once the regions 312, 314 are formed, the pad oxide layer 304 and the nitride layer 308 are removed. In one or more implementations, the layers 304, 308 are removed via a suitable etching technique, such as a plasma etch, or the like.

A gate is formed over the surface of the wafer (Block 204). As illustrated in FIG. 6, a gate oxide layer 316 is then formed over the surface 306. In one or more implementations, the gate oxide layer 316 is thermally grown. The gate oxide layer 316 thickness may vary as a function of differing voltage ratings. For example, the thickness of the gate oxide layer 316 may be greater for greater operating voltage LDMOS devices than lower operating voltage LDMOS devices. For instance, the gate oxide layer 316 may be about 100 Angstroms for a sixty (60) volt device. A polysilicon layer 318 is then formed over the gate oxide layer 316. In one or more implementations, the polysilicon layer 318 may be formed over the gate oxide layer 316 via one or more suitable deposition techniques. The polysilicon layer 318 may then be doped with an impurity to render the layer 318 conductive. A photoresist (not shown) is then applied over the polysilicon layer 318 and selectively etched to form a gate 320. The gate is configured to assist in generating a conduction layer beneath the gate 320 to allow majority carriers between the source and the drain of the LDMOS device when the device is operational.

Once the gate is formed, a well region comprised of a second conductivity type is formed in the wafer (Block 206). As illustrated in FIG. 7, a well region 322 is formed in the wafer 302. In one or more implementations, the well region 322 is comprised of a p-type dopant that is annealed after deposition to form the region 322. A body contact region and a source region are then formed in the well region (Block 208). In an implementation, the source region 324 is comprised of a first conductive type (e.g., an n-type dopant), and the body contact region 326 is comprised of a second conductive material (e.g., a p+ type dopant). Suitable semiconductor formation techniques (e.g., ion implantation, deposition, annealing, etc.) may be utilized to form the source region 324 and the drain contact region 326.

As illustrated in FIG. 4, a source contact region (e.g., source region) is formed in the well region and a drain contact region (e.g., drain region) (Block 210). As described above, the drain region is formed in the extended drain region. As described above with respect to FIGS. 2A through 2B, the extended drain region 312, as illustrated in FIG. 7, has a lower doping level than the drain region 328. In one or more implementations, the extended drain region 312 may have a doping level ranging from approximately 1e15/$cm^3$ to approximately 8e18/$cm^3$.

The field plate is next formed at least partially over and in contact with the gate (Block 212). In one or more implementations, as illustrated in FIG. 7, a passivation layer 330 is formed (e.g., deposited) over the surface 306. The passivation layer 330 is configured to insulate the LDMOS device 300 components (e.g., gate 320, source region 324, drain region 328, etc.) from later semiconductor processing techniques. In one or more implementations, the passivation layer 330 may be an interlayer-dielectric layer (ILD). One or more vias 332 are formed to allow connections to the gate 320, the source region 324, and the drain region 328. The vias 332 may be formed using suitable etching techniques (e.g., a wet etch, a dry etch, combinations thereof, and so forth). A conductive material is deposited in the vias 332 to form contacts 334 that provide electrical interconnections between various components of the device 100. In one or more implementations, the conductive material may be comprised of a polysilicon material, a metal 1 material, a metal 2 material, and so forth. As described above, the contacts 334 form electrodes for the source region 324 and the drain region 328. In one or more implementations, the contact 334A connects the source region 324 and the body contact region 326 together so that the source region 324 and the body region 326 are held at the same potential. The interlayer-dielectric layer may also serve to mitigate crosstalk between the various contacts 334 (e.g., contact 334A, contact 334B).

A field plate 336 is then formed over the passivation layer 330 and in contact with the gate 320 with the contact 334B. As shown in FIG. 7, the field plate 336 at least partially extends laterally over the gate 320 and the LOCOS or the STI region 314. The field plate 336 is configured to assist in shaping the electric field under the LOCOS region 314 to improve the breakdown voltage when the devices 300 are operational. The field plate 336 may be configured in a variety of ways. For example, the field plate 336 may be comprised of a conductive material, such as a metal layer (e.g., a metal 1 layer, a metal 2 layer, etc.) or a polysilicon layer. In one or more implementations, the thickness of the field plate 336 may range from approximately 2000 Angstroms to approximately 40,000 Angstroms. It is contemplated that the length of the field plate 336 is a function of the desired operating voltage. Connecting the field plate 338 to the gate 320 allows for a greater number of gate contacts (see FIGS. 3A and 3B) to reduce the overall gate resistance, which allows designers to create wider devices as a single LDMOS device rather than multiple smaller LDMOS devices that increase the overall footprint and increase parasitic capacitances.

The LDMOS devices 300 illustrated in FIGS. 5 through 7 are fabricated with a bulk substrate wafer. However, it is contemplated that the LDMOS devices can be fabricated with a SOI wafer that is positioned on a handle wafer as described above with respect to FIG. 2B. Moreover, while FIGS. 5 through 7 illustrate an n-channel LDMOS device 300, the devices 300 may also be fabricated as p-channel devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a substrate comprising a bulk substrate of a second conductivity type and having a source region of a first conductivity type and a drain region of the first conductivity type formed proximate to a surface of the substrate,
   a gate, having a gate length ranging from 5 micrometers to 20 micrometers, positioned over the surface of the substrate and between the source region and the drain region;
   an epitaxial region of the first conductivity type having a doping profile ranging from $3e14/cm^3$ to $3e18/cm^3$;
   a well region of the second conductivity type disposed within the epitaxial region,
   wherein the source region is disposed within the well region;
   a local oxidation of silicon (LOCOS) region formed between the source region and the drain region;
   an extended drain region of the first conductivity type having the drain region formed therein, the extended drain region at least partially extending below the LOCOS region and has a doping profile ranging from $1e15/cm^3$ to $8e18/cm^3$;
   a field plate, having a field plate length in a range from 5 micrometers to 50 micrometers, at least partially positioned over and connected to the gate, wherein the gate and the field plate at least partially extend over the LOCOS region and the field plate is configured to shape the electrical field occurring under the LOCOS region and between the source region and the drain region,
   a plurality of source contacts electrically connected to the source region and comprising, in a plan view, a first row of source contacts positioned along and near one side of the gate and a second row of source contacts positioned along and near another side of the gate,
   a plurality of drain contacts electrically connected to the drain region, the plurality of drain contacts comprising, in a plan view, a first row of drain contacts and a second row of drain contacts, each drain contact of the first row of drain contacts having a corresponding drain contact of the second row of drain contacts immediately adjacent thereto;
   a plurality of gate contacts electrically connected to the gate and comprising, in a plan view, one row of gate contacts disposed near one side of the gate and another row of gate contacts disposed near another side of the gate, wherein
   the rows of the plurality of source contacts, the rows of the plurality of drain contacts, and the rows of the plurality of gate contacts are arranged parallel to each other in a plan view.

2. The semiconductor device as recited in claim 1, wherein a doping profile of the extended drain region is three times greater than a doping profile of the epitaxial region.

3. The semiconductor device as recited in claim 1, wherein a length of the field plate is a function of the device operating voltage.

4. The semiconductor as recited in claim 1, further comprising a portion of a handle wafer bonded to the substrate, and a buried oxide layer disposed between the substrate and the portion of the handle wafer.

5. An axi-symmetrical semiconductor device comprising:
   a substrate comprising a bulk substrate of a second conductivity type;
   an epitaxial region of a first conductivity type having a doping profile ranging from $3e14/cm^3$ to $3e18/cm^3$ and disposed above the bulk substrate;
   a well region of the second conductivity type disposed within the epitaxial region,
   wherein the source region is disposed within the well region;
   a source region of the first conductivity type and a drain region of the first conductivity type formed proximate to a surface of the substrate, the source region formed within the well region;
   a gate, having a gate thickness of approximately 500 Angstroms to approximately 8000 Angstroms and a length ranging from 10 micrometers to 20 micrometers, positioned over the surface of the substrate and between the source region and the drain region;
   a local oxidation of silicon (LOCOS) region formed between the source region and the drain region;
   an extended drain region of the first conductivity type having the drain region formed therein, the extended drain region at least partially extending below the LOCOS region and has a doping profile ranging from $1e15/cm^3$ to $8e18/cm^3$;
   a field plate, with a length ranging from 10 micrometers to 50 micrometers, at least partially positioned over the gate and connected to the gate by a connection disposed over the LOCOS region,
   the gate and the field plate at least partially extend over the LOCOS region and configured to shape the electrical field under the LOCOS region and between the source region and the drain region;
   a plurality of gate contacts electrically connected to the gate and disposed, in a plan view, in two rows, one row positioned along and near one side of the gate and another row positioned along and near another side of the gate;
   a plurality of drain contacts electrically connected to the drain region and comprising, in a plan view, of two rows of drain contacts disposed parallel to each other and between two rows of gate contacts; a plurality of source contacts electrically connected to the source region and comprising, in a plan view, a first row of source contacts positioned along and near one row of the gate contacts and a second row of source contacts positioned along and near another row of the gate, such that, in a plan view, the rows of gate contacts are between two rows of source contacts and all rows of the source contacts, drain contacts and gate contacts are parallel to each other.

6. The semiconductor device as recited in claim 5, wherein a doping profile of the extended drain region is three times greater than a doping profile of the epitaxial region.

7. The semiconductor device as recited in claim 5, wherein a length of the field plate is longer than the length of the gate.

8. The semiconductor as recited in claim 5, further comprising a portion of a handle wafer bonded to the substrate, and a buried oxide layer disposed between the substrate and the portion of the handle wafer.

* * * * *